United States Patent [19]

Scavuzzo

[11] 4,349,753
[45] Sep. 14, 1982

[54] EMITTER FUNCTION LOGIC FLIP-FLOP CIRCUIT

[75] Inventor: Robert J. Scavuzzo, Springfield Township, Bucks County, Pa.

[73] Assignee: Bell Telephone Laboratories, Incorporated, Murray Hill, N.J.

[21] Appl. No.: 191,395

[22] Filed: Sep. 29, 1980

[51] Int. Cl.³ .................... H03K 3/289; H03K 19/086
[52] U.S. Cl. ................................. 307/272 A; 307/289; 307/299 A; 307/455
[58] Field of Search ........... 307/455, 467, 289, 272 A, 307/291, 299 A; 365/154, 155, 179

[56] References Cited
U.S. PATENT DOCUMENTS

4,145,623  3/1979  Doucette .......................... 307/289

*Primary Examiner*—John Zazworsky
*Attorney, Agent, or Firm*—Arthur J. Torsiglieri

[57] ABSTRACT

An EFL J-K flip-flop circuit is provided in which feedback of only the true output Q of the slave latch to the input of the master section is required. The circuit in one embodiment includes a slave D-type latch comprising an EFL latch circuit combined with a one level current steering network, a master section comprising an EFL latch circuit combined with a two level current steering network, and an ECL inverter for complementing the K input signal to provide a $\overline{K}$ signal for the master section. All input combinational logic in the master section, including the complementing of the Q feedback signal, takes place in one emitter coupled transistor pair in the second level of the current steering network and at two input emitters of the master section EFL latch circuit. In an alternative embodiment, the ECL inverter is replaced by a third level current switch in the master section. Additional second level current switches may be added to the master and slave sections to provide the flip-flop circuit with asynchronous set and clear functions.

7 Claims, 7 Drawing Figures

(PRIOR ART)

FIG. 7

EMITTER FUNCTION LOGIC FLIP-FLOP CIRCUIT

BACKGROUND OF THE INVENTION

This invention relates to transistor logic circuits and more particularly to transistor flip-flop circuits utilizing so-called Emitter Function Logic (EFL) techniques.

Digital circuits using EFL techniques are known in the art. Such circuits are implemented with bipolar junction transistors and belong to the general class of Current Mode Logic (CML) circuits which also includes Emitter Coupled Logic (ECL) circuits. In general, CML circuits are capable of very high switching speeds, however, for a number of logic functions EFL circuits are known to have lower power-delay products and greater packing density in an integrated circuit than ECL circuits.

The basic EFL gate, which typically comprises a pair of multi-emitter transistors and a pull-up resistor, provides the AND-OR logic function. The basic EFL latch circuit is formed by connecting together one emitter of each transistor in a basic EFL gate. A description of the basic EFL gate and the basic EFL latch is contained in U.S. Pat. No. 3,795,822, issued to Z. E. Skokan on Mar. 5, 1974 and entitled Multi-Emitter Coupled Logic Gate.

Complex logic functions are achieved in EFL circuits by combining the basic EFL gate or the basic EFL latch with a multi-level current steering network of the type commonly used in ECL circuits. Examples of circuits which combine the basic EFL latch with a one level current steering network is described in a paper by Z. E. Skokan, entitled Emitter Function Logic Family for LSI published in the *IEEE Journal of Solid State Circuits* in October 1973 on pages 356 to 361. Examples of circuits which combine the basic EFL latch with a two level current steering network is described in a paper by J. Kane entitled "A Low-Power, Bipolar, Two's Complement Serial Pipeline Multiplier Chip" published in the *IEEE Journal of Solid State Circuits in October,* 1976 on pages 669 to 678.

One problem with the EFL circuit technique is that the highly important J-K flip-flop function is difficult to implement. The logical structure of the J-K flip-flop normally requires the feedback of both the true and complement outputs of the slave latch to an input logic circuit which provides data to the master latch. Since the basic EFL latch circuit does not provide both true and complement outputs, the J-K flip-flop cannot be implemented without resorting to complex circuit techniques which degrade performance, increase power dissipation and enlarge chip layout area when used in an integrated circuit.

A prior art solution to the problem of implementing the J-K flip-flop in EFL is described in U.S. Pat. No. 4,145,623, issued to R. L. Doucette on Mar. 20, 1979 and entitled "Current Mode Logic Compatible Emitter Function Type Logic Family". The Doucette solution requires modification of the basic EFL latch to provide both true and complement outputs. However, these modifications increase the parasitic capacitances at sensitive timing nodes of the latch circuit and thus significantly degrade the performance of the flip-flop circuit in which it is used.

Therefore, a need clearly exists for an EFL J-K flip-flop circuit which does not require modification of the basic EFL latch circuit nor the feedback of both true and complement outputs and which has high performance, low power dissipation and small layout area in an integrated circuit.

SUMMARY OF THE INVENTION

Accordingly, the above and other deficiencies of the prior art are ameliorated by the present invention which is a flip-flop circuit for performing the J-K logic function. The flip-flop circuit comprises a slave section including a D-latch having an output terminal for providing an output signal, a D input terminal, a clock input terminal for receiving a clock signal, and means coupling the clock signal to the clock input terminal, the D-latch being disabled when the clock signal is at a level representative of a first logic state. The flip-flop circuit also comprises a master section having first and second voltage supply terminals, and a latch circuit including a first transistor having first, second and third emitter electrodes, a base electrode and a collector electrode, a second transistor having a first emitter electrode coupled in common with the first emitter electrode of the first transistor, a second emitter electrode coupled to the D input terminal of the D-latch of the slave section, a base electrode coupled to the collector electrode of the first transistor and a collector electrode, first resistance means coupled between the collector electrode of the first transistor and the first voltage supply terminal, and means coupling the collector electrode of the second transistor to the first voltage supply terminal. The master section further comprises a first current switch including a third transistor having emitter, base, and collector electrodes, and a fourth transistor having an emitter electrode coupled in common with the emitter electrode of the third transistor, a base electrode, and a collector electrode, and first current source means coupled between the commonly coupled emitter electrodes of the third and fourth transistors and the second voltage supply terminal. In addition, the master section also comprises means coupling the collector electrode of the third transistor to the second and/or third emitter electrodes of the first transistor, means coupling the collector electrode of the fourth transistor to the commonly coupled emitter electrodes of the first and second transistors, means coupling a first reference voltage to the base electrode of first transistor and means coupling the clock signal to the base electrode of one of the third and fourth transistors and coupling a second reference voltage to the base electrode of the other of the third and fourth transistors for driving the third transistor to the ON state and the fourth transistor to the OFF state when the clock signal is at a level representative of a second logic state. Furthermore, the flip-flop circuit is characterized in that the means coupling the collector electrode of the third transistor to the second and/or third emitter electrodes of the first transistor comprise a second current switch including a fifth transistor having emitter, base, and collector electrodes, and a sixth transistor having an emitter electrode coupled in common with the emitter electrode of the fifth transistor and coupled to the collector electrode of the third transistor, a base electrode, and a collector electrode means coupling the collector electrode of the fifth transistor to the third emitter electrode of the first transistor and means coupling the collector electrode of the sixth transistor to the second emitter electrode of the first transistor. The flip-flop circuit is further characterized in that there are included means coupling the output signal from the D-latch of the slave section to the base electrode of one of the fifth and sixth transistors, means coupling a third reference voltage to the base electrode of the other of the fifth and sixth transistors, means coupling a J input signal to the second emitter electrode of the first transistor, and means coupling a $\overline{K}$ input signal to the third emitter electrode of the first transistor.

DETAILED DESCRIPTION

Figure 1:
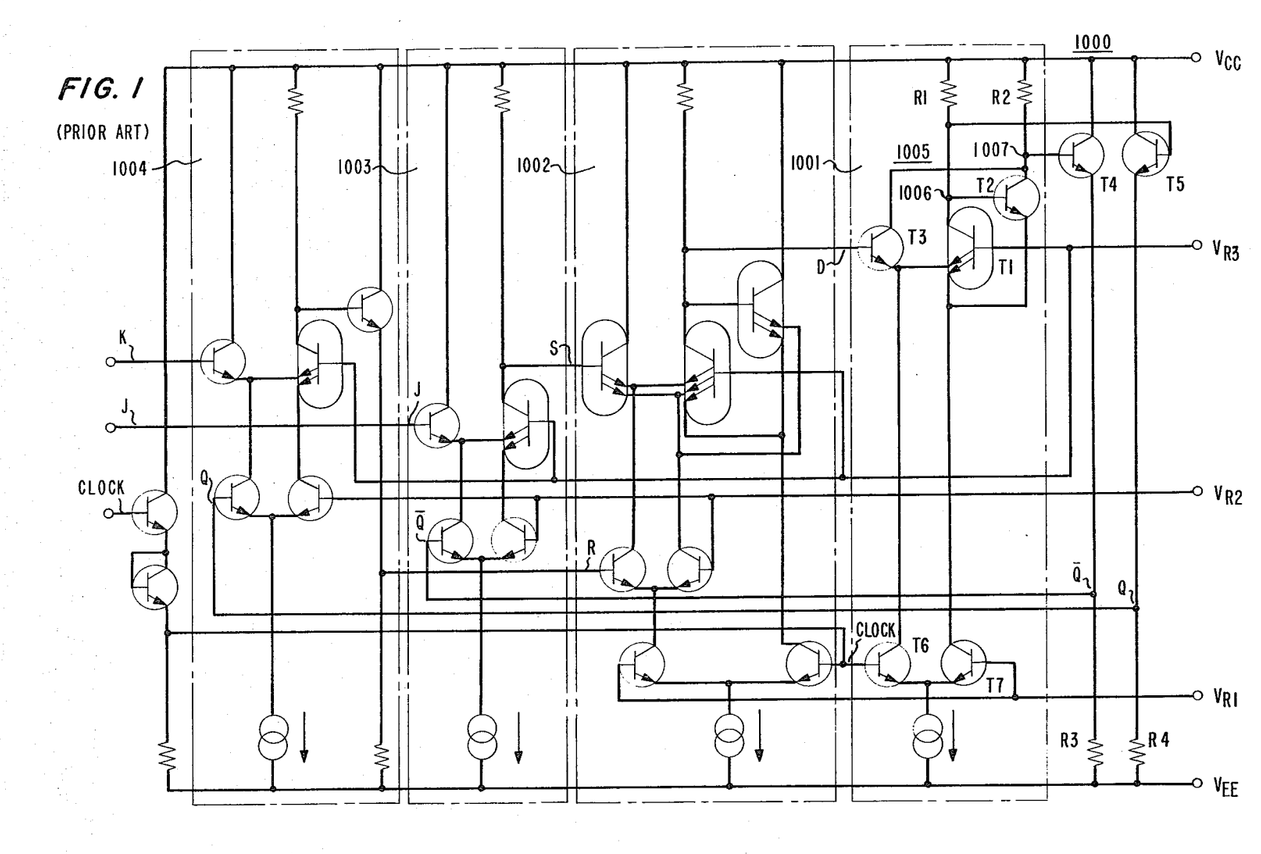
FIG. 1 is a schematic diagram of an EFL J-K flip-flop circuit known in the prior art.
Figure 2:
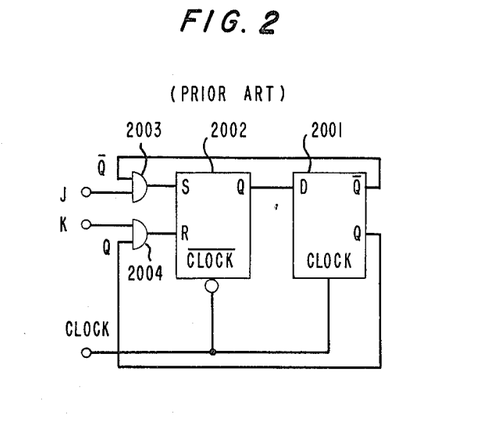
FIG. 2 is a schematic diagram of the logical representation of the prior art flip-flop circuit illustrated in FIG. 1.

Referring now to FIG. 1 there is shown a schematic diagram of an EFL J-K flip-flop circuit 1000 known in the prior art. The details of the structure and operation of this prior art circuit are described in the above-identified Doucette patent. The circuit has a slave section 1001 which comprises a clocked D-latch, a master section which comprises a clocked S-R latch 1002 and an input logic network which comprises two AND gates 1003 and 1004. The schematic diagram of the logic structure of the circuit of FIG. 1 is shown in FIG. 2. Depicted in FIG. 2 are the the interconnections of the D-latch 2001, the S-R latch 2002 and the AND gates 2003 and 2004. Both the D-latch and the S-R latch receive a common clock signal but are respectively enabled by opposite phases of that clock signal. The D-latch receives at its D input the true output Q of the S-R latch. The S input of the S-R latch receives the output from the AND gate 2003 which in turn receives a J input signal and the complement output $\overline{Q}$ from the D-latch. The R input of the S-R latch receives the output from the AND gate 2004 which in turn receives a K input signal and the true output Q from the D-latch. Thus the prior art J-K flip-flop configuration requires the feedback of both the true output Q and the complement output $\overline{Q}$ from the D-latch. Since the basic EFL latch circuit described in the above-identified Skokan patent does not provide a complement output, a modified D-latch must be used to implement the logic structure of FIG. 2.

Referring again to FIG. 1, the slave section 1001 includes a modified EFL latch circuit 1005 which differs from the normal EFL latch circuit by the addition of transistors T3, T4, and T5 and resistors R2, R3, and R4. The modified latch circuit provides the true output Q at the emitter of T5 and the complement output $\overline{Q}$ at the emitter of T4. However, the modifications to the normal EFL latch circuit increase the device count and, therefore, the layout area of the flip-flop circuit. Moreover, the modifications add parasitic capacitances to sensitive timing nodes 1006 and 1007 and thereby significantly degrade the otherwise high performance of the basic EFL latch circuit. Therefore, it would be advantageous to construct an EFL J-K flip-flop using unmodified EFL latch circuits.

Figure 3:
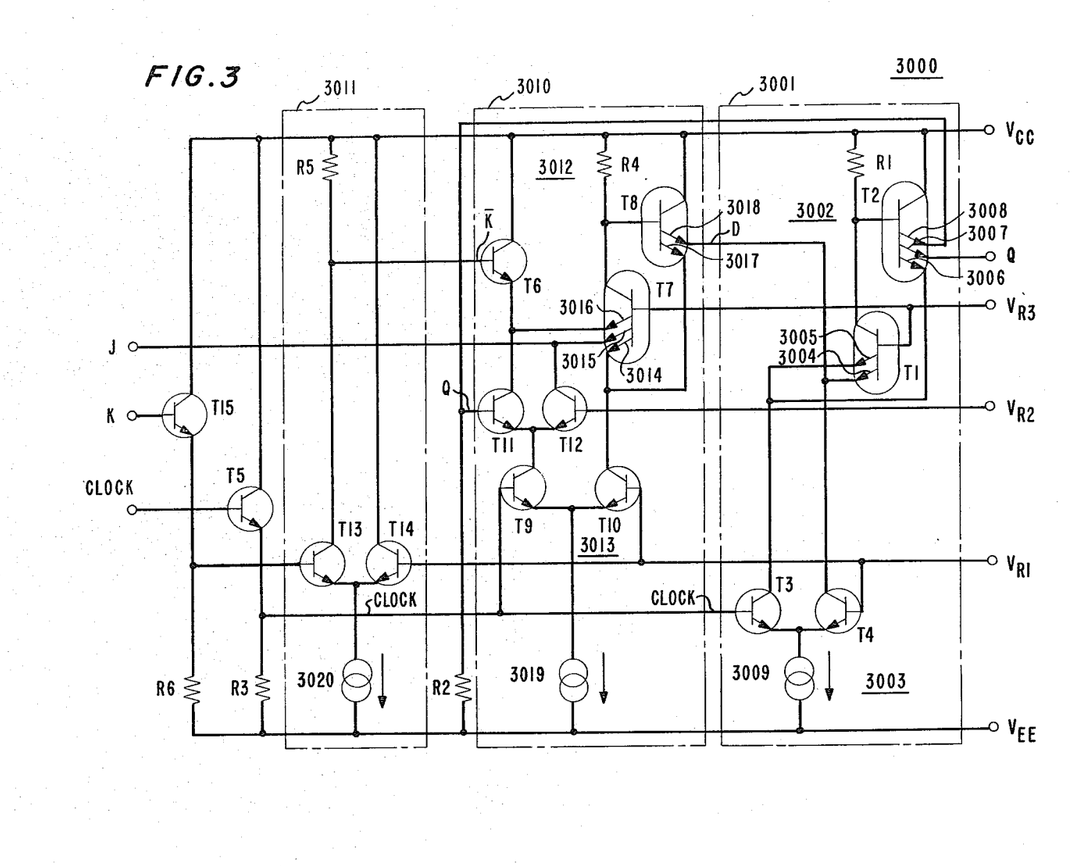
FIG. 3 is a schematic diagram of an EFL J-K flip-flop circuit according to one embodiment of the present invention.

Referring now to FIG. 3, there is shown a schematic diagram of an EFL J-K flip-flop circuit 3000 according to one embodiment of the present invention. The circuit is implemented with NPN junction transistors and operates between $V_{CC}$ and $V_{EE}$ power supply voltages which are provided at respective power supply terminals. In a typical case the power supply voltages are 0 volts for $V_{CC}$ and $-5.2$ volts for $V_{EE}$. The circuit receives J, K, and CLOCK input logic signals and provides a Q (true) output logic signal. The logic function which is performed by a J-K flip-flop may be defined by the following truth table:

| J | K | Q(t) | Q(t + 1) |
|---|---|------|----------|
| 0 | 0 | 0 | 0 |
| 0 | 0 | 1 | 1 |
| 0 | 1 | 0 | 0 |
| 0 | 1 | 1 | 0 |
| 1 | 0 | 0 | 1 |
| 1 | 0 | 1 | 1 |
| 1 | 1 | 0 | 1 |
| 1 | 1 | 1 | 0, | where Q(t) is the present state of the Q output, and Q(t+1) is the next state of the Q output after the occurrence of the triggering edge of a CLOCK pulse. The logic voltage levels for the circuit are nominally $V_{CC}$-$V_{BE}$ for a logic "1" and $V_{CC}$-$2V_{BE}$ for a logic "0", where $V_{BE}$ is the base to emitter voltage drop for a transistor operating in the active region of its characteristics and is approximately equal to 0.80 volts. For the typical case where $V_{CC}$ is at 0 volts, the nominal logic levels are $-0.80$ volts for a logic "1" and $-1.60$ volts for a logic "0".

Figure 4:
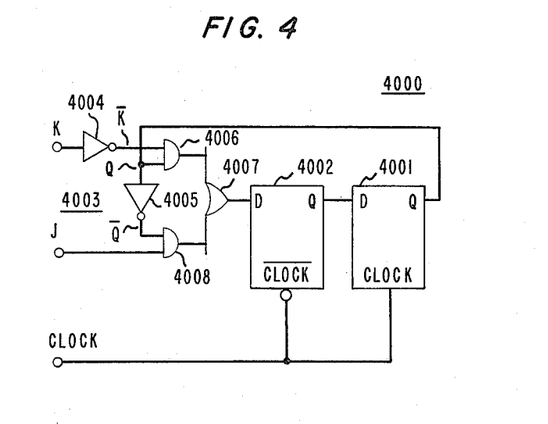
FIG. 4 is a schematic diagram of the logical representation of the flip-flop circuit illustrated in FIG. 3.

Turning now to FIG. 4 there is illustrated a schematic diagram of the equivalent logic structure 4000 of the flip-flop circuit illustrated in FIG. 3. The flip-flop structure comprises a slave D-latch 4001 having D and CLOCK inputs and a Q output, a master D-latch 4002 having D and CLOCK inputs and a Q output, and an input logic network 4003 which receives J and K input signals. The input logic network includes two inverters 4004 and 4005, two AND gates 4006 and 4008, and a NOR gate 4007. The master and slave D-latches are respectively enabled by opposite phases of the same clock signal received at the CLOCK input. The D input of the slave D-latch receives the Q output of the master D latch, and the D-input of the master D-latch receives the output of the NOR gate 4007. In contrast with the prior art flip-flop structure, feedback of only the Q output of the slave D-latch to the input logic network is required.

But for the inventive implementation to be described herein, the J-K flip-flop logic structure of FIG. 4 would otherwise be disadvantageous owing to the numerous logic gates required for its implementation and the necessity of complementing the feedback signal Q in the input logic network to provide a $\overline{Q}$ input signal to the AND gate 4008. Ordinarily such an inversion of Q would be achieved by means of an inverter gating stage.

However, such an inverter stage would introduce a gate delay between the Q signal going to the AND gate 4006 and the $\overline{Q}$ signal going to the AND gate 4008. Such a delay could cause a spurious signal or glitch to appear at the D input of the master D-latch 4002 and may result in faulty operation of the flip-flop circuit. However, according to principles of the present invention, the inversion of the Q signal is achieved without adding a gate delay, and most or all of the input logic network 4003 is incorporated into the master D-latch circuit 4002.

Referring again to FIG. 3, the slave D-latch 3001 of the flip-flop circuit has a known configuration which combines a basic EFL latch circuit 3002 and a one level current steering network 3003. The EFL latch circuit comprises transistors T1 and T2 and pull-up resistor R1. Transistor T1 has two emitters of which a first 3005 is connected in common with the first 3006 of three emitters of T2, and a second emitter of T1 3004 is connected to the D input of the slave section. The base of T1 is connected to reference voltage terminal $V_{R3}$, and the collector of T1 is connected to the base of T2. The second emitter 3007 of T2 is connected to the Q output terminal, and the third emitter of T2, which is used to provide the feedback signal to the input logic network, is connected to the $V_{EE}$ supply terminal through a pull-down resistor R2. A typical value for R2 is 7 kilohms. The collector of T2 is connected to the $V_{CC}$ supply terminal. The pull-up resistor R1 is connected between the collector of T1 and the $V_{CC}$ supply terminal. A typical value for R1 is 4 kilohms. The current steering network 3003 comprises a constant current source 3009 and a differential amplifier current switch comprising transistors T3 and T4 defining a first level of logic. The emitters of T3 and T4 are connected in common. The base of T3 is connected to the clock input node of the slave section while the base of T4 is connected to a reference voltage terminal $V_{R1}$. The collector of T3 is connected to the commonly connected emitters of T1 and T2 while the collector of T4 is connected to the second emitter 3004 of T1. The constant current source which may be either a large valued resistor or an emitter follower circuit having a fixed input reference voltage is connected between the commonly connected emitters of T3 and T4 and the $V_{EE}$ supply terminal. The design of such a constant current source is well known to one skilled in the art of CML circuits.

The CLOCK input signal is applied to the base of T3 through a clock level shifting network comprising transistor T5 and resistor R3. This network shifts the input logic levels by $-V_{BE}$ or approximately $-0.80$ volts to provide appropriate switching levels for the second level of the current steering network. In the illustrated embodiment the slave D-latch is enabled to follow its D input when the CLOCK signal is at a logic "0" level and is disabled or latched when the CLOCK signal is at a logic "1" level. The logic function performed by the slave D-latch may be defined by the following truth table:

| D | Q(t + 1) |
|---|---|
| 0 | 0 |
| 1 | 1, | where Q(t+1) is the next state of the Q output after the occurrence of a CLOCK pulse.

The master section 3010 combines the master D-latch with most of the input logic network 4003 shown in FIG. 4. Only the inverter 4004 for the K input has not been incorporated and is provided in a separate section 3011. Thus, the master section which has J, $\overline{K}$ (complement of K) and CLOCK inputs comprises a basic EFL latch circuit 3012, a two level current steering network 3013, and a pull-up transistor T6. The EFL latch circuit comprises transistors T7 and T8 and pull-up resistor R4. Transistor T7 has three emitters of which a first 3014 is connected in common with one 3017 of two emitters of T8. A second emitter 3015 of T7 is connected to the J input, and a third 3016 of T7 is connected to the emitter of T6. The base of T7 is connected to reference voltage terminal $V_{R3}$, and the collector of T7 is connected to the base of T8. The other emitter 3018 of T8 is connected to the D input of the slave D-latch and the collector of T8 is connected to the $V_{CC}$ supply terminal. The pull-up resistor R4 is connected between the collector of T7 and the $V_{CC}$ supply terminal and has a typical value of 4 kilohms.

The current steering network 3013 comprises a constant current source 3019, a current switch comprising transistors T9 and T10 defining a first level and another current switch comprising of transistors T11 and T12 defining a second level. The emitters of T11 and T12 are connected in common. The base of T11 is connected to the third emitter 3008 of T2 to receive the Q feedback signal, and the collector of T11 is connected to the third emitter 3016 of T7. The base of T12 is connected to reference voltage terminal $V_{R2}$, and the collector of T12 is connected to the second emitter 3015 of T7. The emitters of T9 and T10 are commonly connected. The base of T9 is connected to receive the CLOCK input signal through the clock level shifting network, and the collector of T9 is connected to the commonly connected emitters of T11 and T12. The base of T10 is connected to reference voltage terminal $V_{R1}$, and the collector of T10 is connected to the commonly connected emitters 3014 and 3017 of T7 and T8. The constant current source is connected between the commonly connected emitters of T9 and T10 and the $V_{EE}$ supply terminal. The base of T6 is connected to receive a $\overline{K}$ logic signal and the collector of T6 is connected to the $V_{CC}$.

The $\overline{K}$ logic signal is derived from the K input signal by an inverter stage 3011 of a known design. The inverter stage comprises a constant current source 3020, a current switch consisting of transistors T13 and T14 having commonly connected emitters and a pull-up resistor R5. The constant current source is connected between the commonly connected emitters of T13 and T14 and the $V_{EE}$ supply terminal. The base of T13 is connected to receive the K input signal through a level shifting network consisting of transistor T15 and pull-down resistor R6. This level shifting network changes the input logic levels of the K signal by $-V_{BE}$ to provide appropriate switching levels for the first level current switch of the inverter section 3011. The pull-down resistor R6 has a typical value of 7 kilohms. The collector of T13 is connected to the base of T6. The base of T14 is connected to reference voltage $V_{R1}$ and the collector of T14 is connected to the $V_{CC}$ supply terminal. The pull-up R5 resistor which has a typical value of 4 kilohms is connected between the collector of T13 and the $V_{CC}$ supply terminal.

The reference voltages $V_{R1}$ and $V_{R2}$ and $V_{R3}$ which are applied to the circuit at respective reference voltage terminals have values of $V_{CC}$-0.5$V_{BE}$, $V_{CC}$-1.5$V_{BE}$, $V_{CC}$-2.5$V_{BE}$, respectively. For the typical case where $V_{CC}$ is 0 volts and assuming that $V_{BE}$ is 0.80 volts, $V_{R1}$, $V_{R2}$ and $V_{R3}$ have values of −0.40 volts, −1.20 volts and −2.00 volts, respectively. Where the constant current sources 3009, 3019 and 3020 in the circuit are in the form of emitter followers, an additional reference voltage must be provided to bias the bases of the emitter follower transistors. The value of this reference voltage depends on the current level of the source and the value of the emitter follower resistor. In the typical case in which emitter follower current sources are used, the current source reference voltage and the value of the emitter follower resistor are −4.1 volts and 1.5 kilohms, respectively. These reference voltages may be provided by means external to the flip-flop circuit or by means of a reference voltage network operating between the $V_{CC}$ and $V_{EE}$ voltage supply terminals. The design of such reference voltage networks are well known to one skilled in the art of CML circuit design.

The operation of the flip-flop circuit is now explained. Assume initially that the CLOCK input signal is at a logic "1" level causing the slave D-latch to be disabled and the state of the Q output to remain fixed. In the master section, T9 is turned ON (i.e., the transistor conducts essentially all of the current required by the constant current source) while T10 is turned OFF (i.e., the transistor conducts essentially none of the current required by the constant current source). The output of the master section provided at the second emitter 3018 of T8 is determined by the states of the input signals J and K and feedback signal Q.

Assume that while the CLOCK input signal is at a logic "1" level, input signals J and K are both at logic "0" levels. This causes the base of T6 to be at a logic "1" level by virtue of the $\overline{K}$ signal being at a logic "1" level. Under these conditions T7 is turned ON when Q is at a logic "0" level to turn ON T12, and T7 is turned OFF when Q is at a logic "1" level to turn ON T11. Because virtually no current flows through R4 when T7 is OFF, the base of T8 is biased at substantially $V_{CC}$ causing the output of the master section to provide a logic "1" level. However, when T7 is turned ON, a current flows through R4 to lower the voltage at the base of T8 to a logic "0" level causing the output of the master section to provide a logic "0" level.

Assume now that while the clock input signal is at a logic "1" level, the J input signal is at a logic "1" level and the K input signal is at a logic "0" level. This causes both the second 3015 and the third 3016 emitters of T7 to be held at logic "1" levels. Under these conditions T7 is always turned OFF regardless of the state of Q and the output of the master section always provides a logic "1" level.

Assume now that while the CLOCK input signal is at a logic "1" L level, the J input signal is at a logic "0" level and the K input signal is at a logic "1" level. This causes the base of T6 to be at a logic "0" level by virtue of $\overline{K}$ being at a logic "0" level and the third emitter 3016 of T7 is no longer held at a logic "1" level. Under these conditions regardless of the state of Q, T7 is always turned ON by virtue of one of T11 and T12 being turned ON and the output of the master section always provides a logic "0" level.

Assume now that while the CLOCK input signal is at a logic "1" level, both the J and K input signals are at a logic "1" level. This causes the base of T6 to be at a logic "0" level. Under these conditions, T7 is turned ON when T11 is turned ON and T12 is turned OFF by Q being at a logic "1" level. But T7 is turned OFF when T11 is turned OFF and T12 is turned ON by Q being at a logic "0" level. Thus, the output of the master section provides a logic "1" level when Q is at a logic "0" level and provides a logic "0" level when Q is at a logic "1" level.

When the CLOCK input signal makes a transition from a logic "1" level to a logic "0" level, T3 and T9 are turned OFF while T10 and T4 are turned ON. Under these conditions the master section is latched to store a state which is determined by the states of the J, K, and Q signals immediately prior to the CLOCK signal transition, and the slave D-latch is enabled to permit its Q output to follow the state of the master section. Therefore, the flip-flop circuit illustrated in FIG. 3 changes its state on the logic "1" to logic "0" transistor of the CLOCK input signal. A flip-flop having this property is commonly referred to as a negative edge triggered flip-flop. The flip-flop circuit of FIG. 3 may be readily modified to become a positive edge triggered flip-flop or one which changes its state on the logic "0" to logic "1" transition of the CLOCK input signal by interchanging the clock signal and $V_{R1}$ reference voltage connections at the bases of T9 and T10 and at the bases of T3 and T4.

Figure 5:
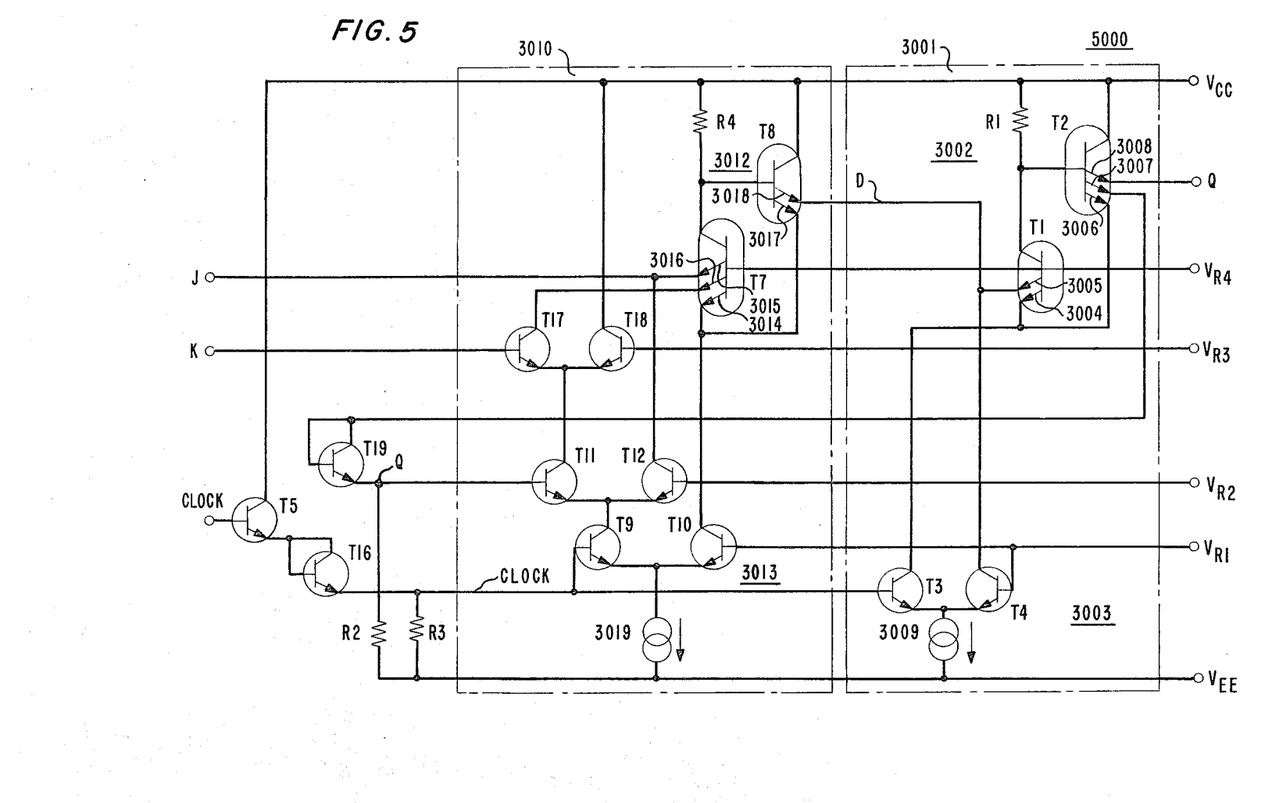
FIG. 5 is a schematic diagram of an EFL J-K flip-flop circuit according to another embodiment of the present invention.

Referring now to FIG. 5 there is shown a schematic diagram of a J-K flip-flop circuit 5000 according to another embodiment of the present invention. For clarity the same reference characters are used in this figure to denote those components and terminals having similar functions as those used in the circuit illustrated in FIG. 3. The circuit of FIG. 5 differs from that of FIG. 3 in the elimination of the inverter stage (3011 in FIG. 3) and in the addition of a third level current switch consisting of transistors T17 and T18 in the current steering network 3013 of the master section 3010. The emitters of T17 and T18 are commonly connected and are also connected to the collector of T11. The base of T17 is connected to the K input terminal, and the collector of T17 is connected to the second emitter 3015 of T7. The base of T18 is connected to reference voltage terminal $V_{R3}$, and the collector of T18 is connected to the $V_{CC}$ supply terminal.

The current switch formed by T17 and T18 performs the equivalent inverting function of the K input signal as the inverter stage in the circuit of FIG. 3. When the K input signal is at a logic "0" level, T17 is turned OFF so essentially no current can flow out of the second emitter 3015 of T7. This is equivalent to pulling the second emitter of T7 up to a logic "1" level through a pull-up transistor. When the K input signal is at a logic "1" level, T17 is turned ON to create a current path from the second emitter of T7 through T17, T11 and T9 provided the Q signal and the CLOCK input signals are also at logic "1" levels.

Although the J input signal is shown in FIG. 5 to be applied to the third emitter 3016 of T7 by a direct connection, the J signal may also be applied by equivalent noninverting means such as another third level current switch interposed between the collector of T12 and the third emitter of T7. Such a current switch would include two transistors having commonly connected emitters which are also connected to the collector of T12. One of the transistors would have its base connected to the J input terminal and its collector connected to th $V_{CC}$ supply terminal, and the other transistor would have its base connected to the $V_{R3}$ reference voltage terminal and its collector connected to the third emitter of T7.

The circuit configuration of FIG. 5 is advantageous in that only two current sources are required for its implementation. However, the circuit requires four reference voltages. The bases of T7 and T1 being connected to receive $V_{R4}$, the base of T18 being connected to receive $V_{R3}$, the base of T12 being coupled to receive $V_{R2}$ and the bases of T10 and T4 being coupled to receive $V_{R1}$. The reference voltages $V_{R4}$ through $V_{R1}$ have values of $V_{CC}$-0.5$V_{BE}$, $V_{CC}$-1.5$V_{BE}$, $V_{CC}$-2.5$V_{BE}$, and $V_{CC}$-3.5$V_{BE}$, respectively. In addition, where emitter follower current sources are used, a separate current source reference voltage must be provided. This current source reference voltage may not exceed reference voltage $V_{R1}$ by more than 0.5$V_{BE}$. In the typical case where $V_{CC}$=0 volts, $V_{EE}$=-5.2 volts and $V_{BE}$=0.80 volts the values for the reference voltages $V_{R4}$ through $V_{R1}$ and the current source reference voltage are −0.40 volts, −1.20 volts, −2.00 volts, −2.80 volts and −4.1 volts, respectively. It should be noted that the reference voltages must all have values which lie between $V_{CC}$ and $V_{EE}$. Consequently, where the difference between $V_{CC}$ and $V_{EE}$ is too small to encompass all the reference voltages required for the flip-flop. Therefore, the circuit illustrated in FIG. 5 cannot be used. However, the circuit of FIG. 3 may still be used.

Another consequence of the addition of a third level to the current steering network of the master section is that the CLOCK input signal logic levels must be shifted by −2$V_{BE}$ before being applied to the bases of T3 and T9 in the first level of the current steering network. Therefore, the clock level shifting network includes an additional transistor T16 connected as a diode in series between T5 and R3, and the bases of T3 and T9 are connected to the emitter of T16. Similarly, the feedback signal logic levels applied to the base of T11 in the second level of the current steering network must be shifted by −$V_{BE}$. Therefore, the feedback path between the second emitter 3007 of T2 and the base of T11 includes transistor T19 which is connected as a diode. The function on operation of the rest of the circuit is similar to the flip-flop circuit illustrated in FIG. 3 which has been described. Therefore, no further description thereof is deemed necessary.

Figure 6:
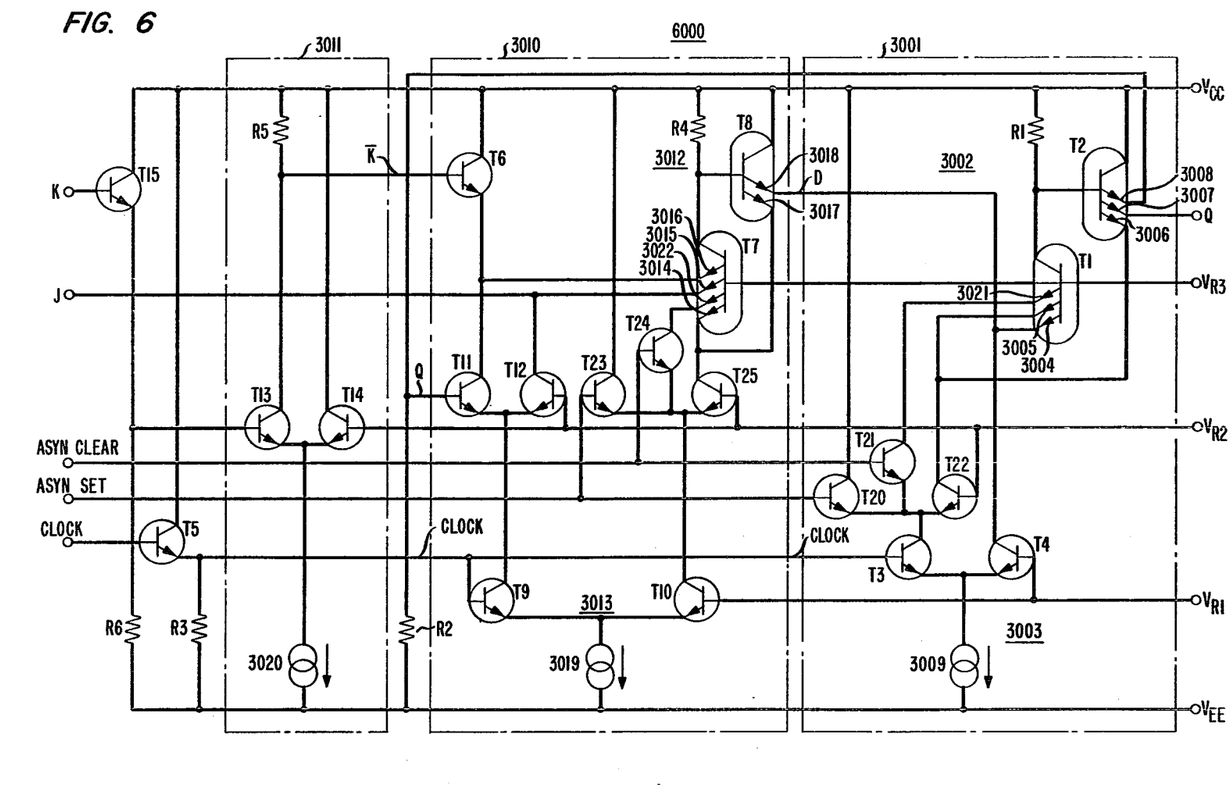
FIG. 6 is a schematic diagram of a flip-flop circuit which is similar to the one illustrated in FIG. 3 but including provisions for asynchronous set and clear functions.

Turning now to FIG. 6 there is shown a schematic diagram of a J-K flip-flop circuit 6000 which is similar to the circuit illustrated in FIG. 3 but modified to include provisions for receiving asynchronous set or clear input signals. Once again for clarity, the same reference characters used in FIG. 3 are being used in the figure to denote those components and terminals having similar functions to those in the circuit of FIG. 3. The modifications include the addition of ASYN SET and ASYN CLEAR input terminals, a third emitter 3021 to transistor T1, a fourth emitter 3022 to transistor T7, a second level current switch comprising transistors T20, T21 and T22 to the slave section 3001 and another second level current switch comprising transistors T23, T24, and T25 in the master section 3010. The emitters of T20, T21, and T22 are connected in common and to the collector of T3. The base of T20 is connected to an ASYN SET input terminal, and the collector of T20 is connected to the $V_{CC}$ supply terminal. The base of T21 is connected to the ASYN CLEAR, input terminal, and the collector of T21 is connected to the third emitter 3021 of T1. The base T22 is connected to the $V_{R2}$ reference voltage terminal, and the collector of T22 is connected to the commonly coupled emitters 3005 and 3006 of T1 and T2. The emitters of T23, T24, and T25 are connected in common and to the collector of T10. The base of T23 is connected to the ASYN SET terminal, and the collector of T23 is connected to the $V_{CC}$ supply terminal. The base of T24 is connected to the ASYN CLEAR terminal, and the collector of T24 is connected to the fourth emitter 3022 of T7. The base of T25 is connected to the $V_{R2}$ reference voltage terminal, and the collector of T25 is connected to the commonly coupled emitters 3014 and 3017 of T7 and T8.

By applying appropriate logic signals to the ASYN SET and ASYN CLEAR input terminals the state of the flip-flop circuit may be set to a logic "1" or a logic "0" regardless of the state of the CLOCK signal. For the case when the CLOCK input signal is at a logic "0" level, T3 and T9 are turned OFF while T4 and T10 are turned ON. The slave section is enabled to permit the Q output to follow the D input, and the current switch comprising T20, T21 and T22 is inoperative because no current path is provided for their commonly connected emitters. In the master section the current switch comprising T23, T24 and T25 is operative by virtue of T10 being ON. The master section latch circuit 3012 does not respond to the J, K and feedback signals because T9 is turned OFF. When the ASYN set and ASYN CLEAR input terminals are both at logic "0" levels, T23 and T24 are turned OFF while T25 is turned ON and a current path exists through T25 and T10 for the commonly connected emitters of T7 and T8 to enable the master section latch circuit 3012.

When the ASYN CLEAR terminal is at a logic "1" level and the ASYN SET input is at a logic "0" level, T24 is turned ON while T23 and T25 are turned OFF. Under these conditions the master section latch circuit 3012 is enabled and T7 is turned ON owing to the existence of a current path through T24 and T10 for the fourth emitter 3022 of T7. Consequently, the base of T8 goes to a logic "0" level and the output of the master section provides a logic "0" level. The Q output of the slave section which follows the state of the master section also provides a logic "0" level. When the ASYN CLEAR terminal returns to a logic "0" level, T23 is turned OFF and T25 is turned ON and the master section latch circuit is disabled to store the logic "0" state.

When the ASYN CLEAR terminal is at a logic "0" level and the SYN SET terminal is at a logic "1" level T23 is turned ON while T24 and T25 are turned OFF. Under these conditions no current path exists for any of the emitters of T7. Therefore, T7 is turned OFF and the output of the master section provides a logic "1" level. The Q output of the slave section also provides a logic "1" level. When the ASYN SET terminal returns to a logic "0" level, T23 turns OFF and T25 turns ON, and the master section latch circuit is disabled to store the logic "1" state.

For the case when the CLOCK terminal is at a logic "1" level, T9 and T3 are turned ON while T4 and T10 are turned OFF. In the master section the current switch comprising T23, T24 and T25 is inoperative because no current path exists for their commonly coupled emitters. In the slave section the current switch comprising T20, T21 and T22 is operative by virtue of the T3 being ON. The slave section latch circuit 3002 does not respond to the state of the D-input because T4 is turned OFF. When the ASYN SET and ASYN CLEAR terminals are both at logic "0" levels, T20 and T21 are turned OFF while T22 is turned ON causing, the slave section latch circuit 3002 to be latched.

When the ASYN CLEAR terminal is at a logic "1" level and the ASYN SET terminal is at a logic "0" level, T21 is turned ON while T20 and T22 are turned OFF. Under these conditions the slave section latch circuit is enabled and T1 is turned ON owing to the existence of a current path through T21 and T3 for the third emitter 3021 of T1. Consequently, the base of T2 is at a logic "0" level and the Q output provides a logic "0" state. When the ASYN CLEAR terminal returns to the logic 37 0" level, T20 is turned OFF and T22 is turned ON, and the slave section latch is disabled to store the logic "0" state.

When the ASYN CLEAR terminal is at a logic "0" level and the ASYN SET is at a logic "1" level, T20 is turned ON while T21 and T22 are turned OFF. Under these conditions, no current path is provided for any of the emitters of T1. Consequently, T1 is turned OFF and the base of T2 is at a logic "1" level causing the Q output to provide a logic "1" level. When the ASYN SET terminal returns to a logic "0" level, T20 is turned OFF while T22 is turned ON, and the slave section latch is disabled to store the logic "1" state.

It should be noted that the ASYN SET and the ASYN CLEAR terminals must not both be at logic "1" levels simultaneously as that would cause the Q output to go to an undeterminable logic state.

As an alternative to the configuration depicted in FIG. 6, the collector of T21, rather than being connected to a third emitter 3021 of T1, may instead be connected to the second emitter 3004 of T1, and the collector of T24, rather than being connected to a fourth emitter 3022 of T7, may instead be connected to either the third 3015 or the fourth 3016 emitter of T7. The operation of the set and clear functions would remain essential as described above.

The function and operation of the rest of the circuit is similar to those of the circuit illustrated in FIG. 3 which has been described. Therefore, no further description thereof is deemed necessary.

Figure 7:
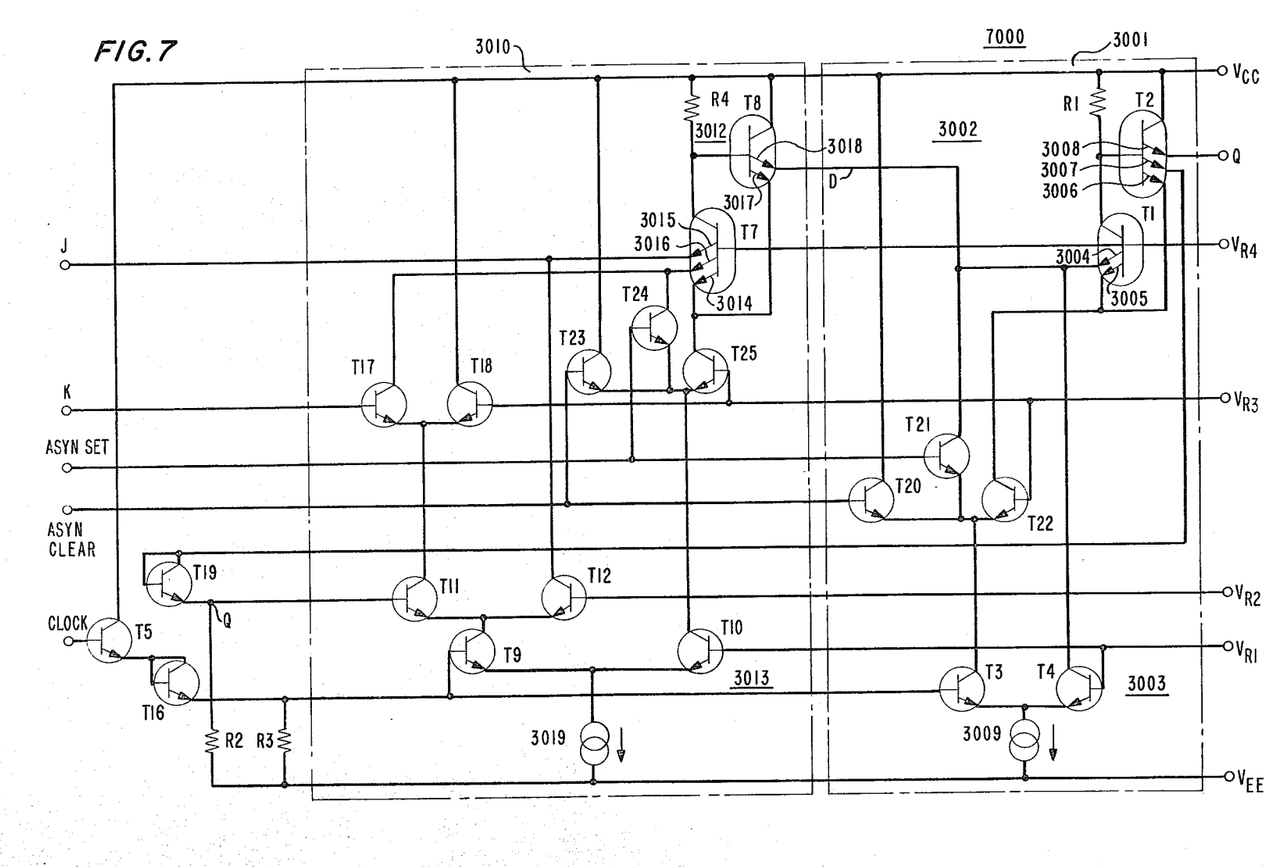
FIG. 7 is a schematic diagram of a flip-flop circuit which is similar to the one illustrated in FIG. 5 but including provisions for asynchronous set and clear functions.

Referring now to FIG. 7, there is shown a schematic diagram of a J-K flip-flop circuit 7000 which is similar to that of FIG. 5 but modified to include provisions for receiving asynchronous set or clear input signals. Once again for clarity, the same reference characters used in FIG. 5 are being used in this figure to denote those components and terminals having similar functions to those in the circuit of FIG. 5. The modifications include the addition of ASYN SET and ASYN CLEAR input terminals, a third level current switch comprising transistors T20, T21 and T22 in the slave section 3001 and another third level current switch comprising transistors T23, T24 and T25 in the master section 3010. The emitters of T20, T21 and T22 are connected in common and to the collector of T3. The base of T20 is connected to the ASYN CLEAR input terminal and the collector of T20 is connected to the $V_{CC}$ supply terminal. The base of T21 is connected to the ASYN SET input terminal, and the collector of T21 is connected to the second emitter 3004 of T1. The base of T22 is connected to the $V_{R3}$ reference terminal, and the collector of T22 is connected to the commonly connected emitters 3005 and 3006 of T1 and T2. The emitters of T23, T24 and T25 are connected in common and to the collector of T10. The base of T23 is connected to the ASYN CLEAR input terminal, and the collector of T23 is connected to the $V_{CC}$ supply terminal. The base of T24 is connected to the ASYN SET input terminal, and the collector of T24 is connected to the second emitter 3015 of T7. The base of T25 is connected to the $V_{R3}$ reference voltage terminal and the collector of T25 is connected to the commonly connected emitters 3014 and 3017 of T7 and T8.

The operation of the additional current switches in providing asynchronous set and clear functions to the flip-flop circuit of FIG. 7 is similar to that of the additional current switches in the circuit of FIG. 6 which has been described above. The function and operation of the rest of the circuit is similar to those of the circuit of FIG. 5 which has been described. Therefore, no further description of those is deemed necessary.

As an alternative to the configuration depicted in FIG. 7, the collector of T21, rather than being connected to the second emitter 3005 of T1, may instead be connected to a third emitter (not shown) of T1, and the collector of T24, rather than being connected to the second emitter 3015 of T7, may instead be connected to either the third emitter 3016 or a fourth emitter (not shown) of T7. The operation of the set and clear function would remain essentially as described above.

In some instances it may be desirable to have a J-K flip-flop which provides the complement output $\overline{Q}$ instead of a true output Q. Such a flip-flop may be achieved according to the present invention by substituting a slave D-latch which provides the $\overline{Q}$ output instead of the Q output. Such a D-latch which is sometimes also referred to as a $\overline{D}$-latch may be implemented in EFL and one such implementation is disclosed in a copending application having Ser. No. 191,369 filed concurrently with the instant application. In addition the feedback signal to the master section would be the $\overline{Q}$ signal of the slave D-latch which would be connected to the base of T12 instead of to the base of T11 as in each of the disclosed circuits. Furthermore, the base of T11 would be connected to reference voltage terminal $V_{R2}$ instead of the base of T12 as in each of the disclosed circuits.

It will be understood by those skilled in the art that the foregoing and other modifications and alterations may be made to the described embodiment without departing from the spirit and scope of the present invention. For example, the disclosed circuit techniques may be implemented with PNP bipolar transistors with appropriate modifications, such as to the power supply voltages, reference voltages and logic levels as would be obvious to one skilled in the art, and the J and K input terminals of the J-K flip-flop circuit may be connected together to form a toggle flip-flop.

The subject matter of this application is related to that of copending application having Ser. Nos. 191,394; 191,393; and 191,369, all concurrently filed with the instant application.

I claim:

1. A flip-flop circuit for performing the J-K logic function comprising:
 a slave section including a D-latch having an output terminal for providing an output signal, a D input terminal, a clock input terminal for receiving a clock signal, and means coupling the clock signal to the clock input terminal, the D-latch being disabled when the clock signal is at a level representative of a first logic state.
 a master section comprising: first and second voltage supply terminals; a latch circuit including a first transistor having first, second and third emitter electrodes, a base electrode and a collector electrode, and a second transistor having a first emitter electrode coupled in common with the first emitter electrode of the first transistor, a second emitter electrode coupled to the D input terminal of the D-latch of the slave section, a base electrode coupled to the collector electrode of the first transistor, and a collector electrode, first resistance means coupled between the collector electrode of the first transistor and the first voltage supply terminal, and means coupling the collector electrode of the second transistor to the first voltage supply terminal; a first current switch including a third transistor having emitter, base, and collector electrodes, and a fourth transistor having an emitter electrode coupled in common with the emitter electrode of the third transistor, a base electrode and a collector electrode; first current source means coupled between the commonly coupled emitter electrodes of the third and fourth transistors and the second voltage supply terminal; means coupling the collector electrode of the third transistor to the second and/or third emitter electrodes of the first transistor; means coupling the collector electrode of the fourth transistor to the commonly coupled emitter electrodes of the first and second transistors; means coupling a first reference voltage to the base electrode of first transistor; means coupling a clock signal to the base electrode of one of the third and fourth transistors and coupling a second reference voltage to the base electrode of the other of the third or fourth transistors for driving the third transistor to the OFF state and the fourth transistor to the ON state when the clock signal is at a level representative of a second logic state;

characterized in that the means coupling the collector electrode of the third transistor to the second and/or third emitter electrodes of the first transistor comprise a second current switch including a fifth transistor having emitter, base, and collector electrodes, and a sixth transistor having an emitter electrode coupled in common with the emitter electrode of the fifth transistor and coupled to the collector electrode of the third transistor, a base electrode, and a collector electrode, means coupling the collector electrode of the fifth transistor to the third emitter electrode of the first transistor; means coupling the collector electrode of the sixth transistor to the second emitter electrode of the first transistor and there are included means coupling the output signal from the D-latch of the slave section to the base electrode of one of the fifth and sixth transistors; means coupling a third reference voltage to the base electrode of the other of the fifth and sixth transistors; means coupling a J input signal to the second emitter electrode of the first transistor; and means coupling a $\overline{K}$ input signal to the third emitter electrode of the first transistor.

2. A flip-flop circuit as recited in claim 1 further characterized in that the means for coupling the $\overline{K}$ signal to the third emitter electrode of the first transistor include an inverter circuit comprising: a third current switch including a seventh transistor having emitter, base, and collector electrodes, and an eighth transistor having an emitter electrode coupled in common with the emitter electrode of the seventh transistor, a base electrode, and a collector electrode coupled to the first voltage supply terminal; second current source means coupled between the commonly coupled emitter electrodes of the seventh and eighth transistors and the second voltage supply terminal; second resistance means coupled between the collector electrode of the seventh transistor and the first voltage supply terminal; a ninth transistor having an emitter electrode coupled to the third emitter electrode of the first transistor, a base electrode coupled to the collector electrode of the seventh transistor and a collector electrode coupled to the first voltage supply terminal; means coupling the second reference voltage to the base electrode of the eighth transistor; and means coupling a K signal to the base electrode of the seventh transistor.

3. A flip-flop circuit as recited in claim 1 further characterized in that the means for coupling the $\overline{K}$ signal to the third emitter of the first transistor includes inverter means which is included in the means coupling the collector electrode of the fifth transistor to the third emitter electrode of the first transistor, the inverter means comprising a fourth current switch including a seventh transistor having an emitter electrode, a base electrode, and a collector electrode coupled to the third emitter electrode of the first transistor, and an eighth transistor having an emitter electrode coupled in common with the emitter electrode of the seventh transistor, a base electrode, and a collector coupled to the first voltage supply terminal; means coupling a fourth reference voltage to the base electrode of the eighth transistor; and means coupling a K signal to the base electrode of the seventh transistor.

4. A flip-flop circuit as recited in claim 2 wherein the D-latch of the slave section comprises: first and second voltage supply terminals; a latch circuit including a tenth transistor having a first emitter electrode, a second emitter electrode coupled to the D-input terminal, a base electrode and a collector electrode, and an eleventh transistor having a first emitter electrode coupled in common with the first emitter electrode of the tenth transistor, a second emitter electrode coupled to the output terminal, a base electrode coupled to the collector electrode of the tenth transistor, and a collector electrode, third resistance means coupled between the collector electrode of the tenth transistor and the first voltage supply terminal, and means coupling the collector electrode of the eleventh transistor to the first voltage supply terminal; a fourth current switch including a twelfth transistor having emitter, base and collector electrodes, and a thirteenth transistor having an emitter electrode coupled in common with the emitter electrode of the twelfth transistor, a base electrode, and a collector electrode; means coupling the collector electrode of the twelfth transistor to the commonly coupled first emitter electrodes of the tenth and eleventh transistors; means coupling the collector electrode of the thirteenth transistor to the second emitter electrode of the tenth transistor; third current source means coupled between the commonly coupled emitter electrodes of the twelfth and thirteenth transistors and the second voltage supply terminal; means coupling the first reference voltage to the base electrode of the tenth transistor, means coupling the clock input terminal to the base electrode of one of the twelfth and thirteen transistors and coupling the second reference voltage to the base electrode of the other of the twelfth and thirteenth transistors for driving the twelfth transistor to the ON state and the thirteenth transistor to the OFF state when the clock signal is at a level representative of the first logic state; further characterized in that the means for coupling the true output signal from the D-latch of the slave section to the base electrode of the fifth transistor include a third emitter electrode in the eleventh transistor coupled to the base electrode of the fifth transistor and fourth resistance means coupled between the base electrode of the fifth transistor and the second voltage supply terminal.

5. A flip-flop circuit as recited in claim 3 wherein the D-latch of the slave section comprises first and second voltage supply terminals; a latch circuit including a tenth transistor having a first emitter electrode, a second emitter electrode coupled to the D input terminal, a base electrode and a collector electrode, and an eleventh transistor having a first emitter electrode coupled in common with the first emitter electrode of the tenth transistor, a second emitter electrode coupled to the output terminal, a base electrode coupled to the collector electrode of the tenth transistor and a collector electrode, third resistance means coupled between the collector electrode of the tenth transistor and the first voltage supply terminal, and means coupling the collector electrode of the eleventh transistor to the first voltage supply terminal; a fourth current switch including a twelfth transistor having emitter, base and collector electrodes, and a thirteenth transistor having an emitter electrode coupled in common with the emitter electrode of the twelfth transistor, a base electrode, and a collector electrode; means coupling the collector electrode of the twelfth transistor to the commonly coupled first emitter electrodes of the tenth and eleventh transistors; means coupling the collector electrode of the thirteenth transistor to the second emitter electrode of the tenth transistor; third current source means coupled between the commonly coupled emitter electrodes of the twelfth and thirteenth transistors and the second voltage supply terminal; means coupling the first reference voltage to the base electrode of the tenth transistor and, means coupling the clock input terminal to the base electrode of one of the twelfth and thirteenth transistors and coupling the second reference voltage to the base electrode of the other of the twelfth or thirteenth transistors for driving the twelfth transistor to the ON state and the thirteenth transistor to the OFF state when the clock signal is at a level representative of the first logic state; further characterized in that the means for coupling the true output signal from the D-latch of the slave section to the base electrode of the fifth transistor include a third emitter electrode in the eleventh transistor coupled to the base electrode of the fifth transistor through diode means and fourth resistance means coupled between the base electrode of the fifth transistor and the second voltage supply terminal.

6. A flip-flop circuit as recited in claim 4 further characterized in that the means coupling the collector electrode of the fourth transistor to the commonly coupled first emitter electrodes of the first and second transistors comprise a fifth current switch including a fourteenth transistor having an emitter electrode, a base electrode, and a collector electrode coupled to the first voltage supply terminal, a fifteenth transistor having an emitter electrode coupled in common with the emitter electrode of the fourteenth transistor, a base electrode, and a collector electrode coupled to one of the second and third emitter electrodes or a fourth emitter electrode of the first transistor, and a sixteenth transistor having an emitter electrode coupled in common with the emitter electrodes of the fourteenth and fifteenth transistors and coupled to the collector electrode of the fourth transistor, a base electrode, and a collector electrode coupled to the commonly coupled first emitter electrodes of the first and second transistors; the means coupling the collector electrode of the twelfth transistor to the commonly coupled first emitter electrodes of the tenth and eleventh transistors include a sixth current switch including a seventeenth transistor having an emitter electrode, a base electrode, and a collector electrode coupled to the first voltage supply terminal, an eighteenth transistor having an emitter electrode coupled in common with the emitter electrode of the seventeenth transistor, a base electrode, and a collector electrode coupled to the second emitter electrode or a third emitter electrode of the tenth transistor, and a nineteenth transistor having an emitter electrode coupled in common with the emitter electrodes of the seventeenth and eighteenth transistors and coupled to the collector electrode of the twelfth transistor, a base electrode, and a collector electrode coupled to the commonly coupled first emitter electrodes of the tenth and eleventh transistors; and there are included means for coupling the third reference voltage to the base electrodes of the sixteenth and nineteenth transistors; means for coupling a SET signal to the base electrodes of the fourteenth and seventeenth transistors; and means for coupling a CLEAR signal to the base electrodes of the fifteenth and eighteenth transistors.

7. A flip-flop circuit as recited in claim 5 further characterized in that the means coupling the collector electrode of the fourth transistor to the commonly coupled first emitter electrodes of the first and second transistors comprise a fifth current switch including a fourteenth transistor having an emitter electrode, a base electrode, and a collector electrode coupled to the first voltage supply terminal, a fifteenth transistor having an emitter electrode coupled in common with the emitter electrode of the fourteenth transistor, a base electrode, and a collector electrode coupled to one of the second and third emitter electrodes or a fourth emitter electrode of the first transistor, and a sixteenth transistor having an emitter electrode coupled in common with emitter electrodes of the fourteenth and fifteenth transistors and coupled to the collector electrode of the fourth transistor, a base electrode, and a collector electrode coupled to the commonly coupled first emitter electrodes of the first and second transistors; the means coupling the collector electrode of the twelfth transistor to the commonly coupled first emitter electrodes of the tenth and eleventh transistors include a sixth current switch including a seventeenth transistor having an emitter electrode, a base electrode, and a collector electrode coupled to the first voltage supply terminal, an eighteenth transistor having an emitter electrode coupled in common with the emitter electrode of the seventeenth transistor, a base electrode, and a collector electrode coupled to the second emitter electrode or a third emitter electrode of the tenth transistor, and a nineteenth transistor having an emitter electrode coupled in common with the emitter electrodes of the seventeenth and eighteenth transistors and coupled to the collector electrode of the twelfth transistor, a base electrode, and a collector electrode coupled to the commonly coupled first emitter electrodes of the tenth and eleventh transistors; and there are included means for coupling the third reference voltage to the base electrodes of the sixteenth and nineteenth transistors, means for coupling a SET signal to the base electrodes of the fourteenth and seventeenth transistors; and means for coupling a CLEAR signal to the base electrodes of the fifteenth and eighteenth transistors.

* * * * *